Figure 1:
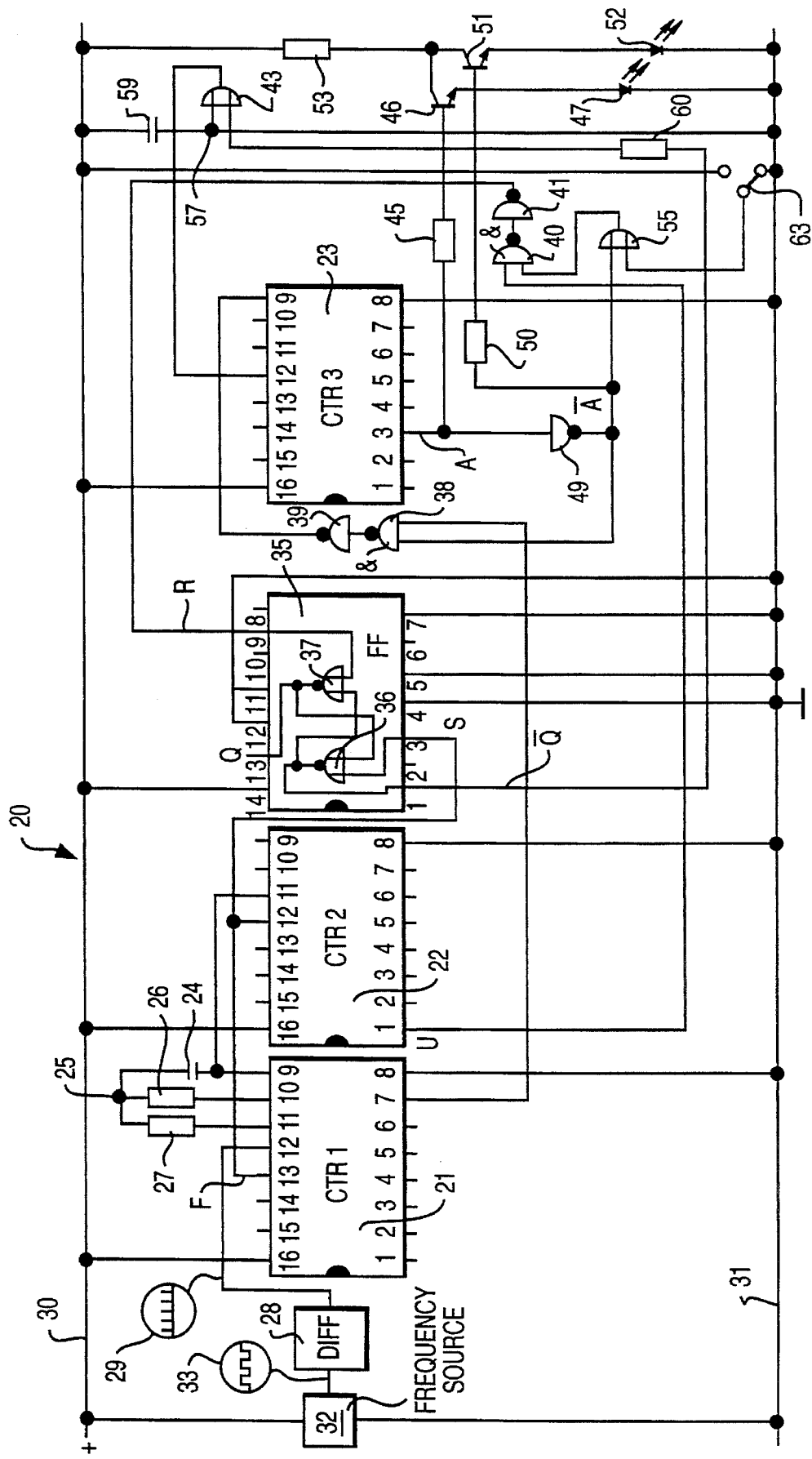

United States Patent [19]
Baumann et al.

[11] Patent Number: 5,469,148
[45] Date of Patent: Nov. 21, 1995

[54] FREQUENCY MONITORING DEVICE

[75] Inventors: Hans-Martin Baumann, Gutach; Rolf Müller, München, both of Germany

[73] Assignee: Papst Licensing GmbH, Spaichingen, Germany

[21] Appl. No.: 761,886

[22] PCT Filed: Mar. 20, 1989

[86] PCT No.: PCT/EP89/00296

§ 371 Date: Nov. 1, 1991

§ 102(e) Date: Nov. 1, 1991

[87] PCT Pub. No.: WO90/11531

PCT Pub. Date: Oct. 4, 1990

[51] Int. Cl.[6] .................................................. G08B 21/00
[52] U.S. Cl. ........................ 340/658; 340/635; 340/679; 388/820; 388/921
[58] Field of Search .................................. 340/658, 635, 340/679, 670; 388/820, 921

[56] References Cited

U.S. PATENT DOCUMENTS

| | | | |
|---|---|---|---|
| 4,507,591 | 3/1985 | Kelleher | 318/254 |
| 4,513,233 | 4/1985 | Giammarrusco | 318/565 |
| 4,521,894 | 6/1985 | Moffat | 377/16 |
| 4,544,852 | 10/1985 | Moosman et al. | 307/519 |
| 4,695,779 | 9/1987 | Yates | 318/484 |

FOREIGN PATENT DOCUMENTS 2025865  12/1970  Germany.

OTHER PUBLICATIONS

C. Veloyudhan et al., "An Electronic Frequency Deviation Transducer", International Journal of Electronics, vol. 52, No. 3, Mar. 1982, pp. 283–289 (Taylor & Francis Ltd.).
Intel Corp. Component Data Catalog, Jan., 1982 "8253/8253-5 Programmable Interval Timer" and 8254 Programmable Interval Timer.

Primary Examiner—John K. Peng
Assistant Examiner—Edward Lefkowitz
Attorney, Agent, or Firm—Finnegan, Henderson, Farabow, Garrett and Dunner

[57] ABSTRACT

A frequency to be monitored is taken to a counter for the continuous measurement of its cycle time. The counter is so set that, when this frequency drops, i.e. when its cycle time increases, it reaches a certain condition and issues error signals (flags) as long as the condition lasts. The first flag actuates a flip-flop which in turn actuates a timer (alarm counter) which, after a short time, triggers an alarm unless it has previously been stopped by the resetting of the flip-flop. The flags are also continuously sent to a second counter which is so arranged that it cannot reach a certain (high) condition in the interval between two successive flags for a continued condition of the first counter. If the frequency to be monitored becomes normal again, the flags disappear and the last flag occurring once again starts this second counter so that it rises to the preset (high) position and emits a reset signal. If the alarm has not yet been triggered, this reset signal can reset the flip-flop and thus cancel its actuated state. Thus the timer (alarm counter) is stopped and the triggering of an alarm is prevented.

13 Claims, 7 Drawing Sheets

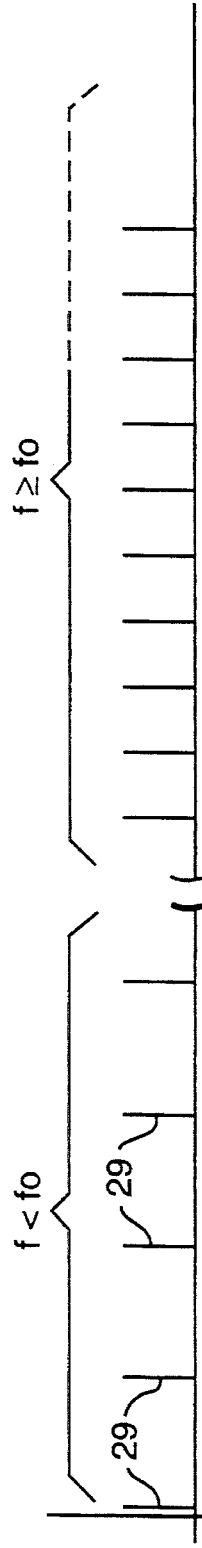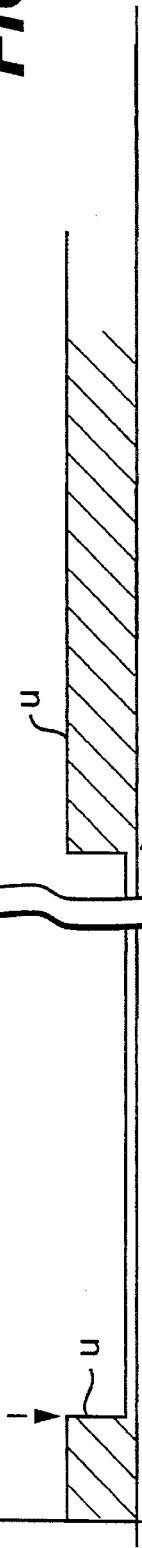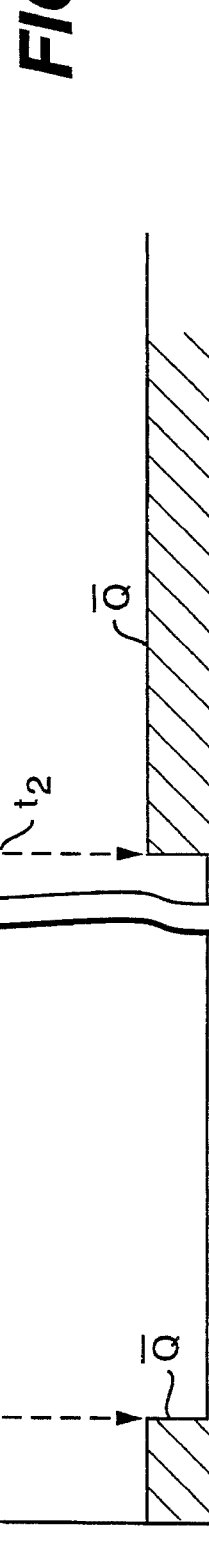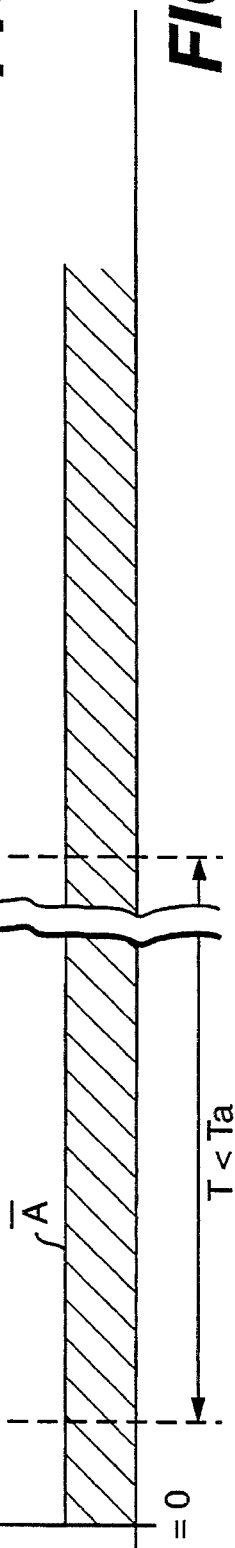

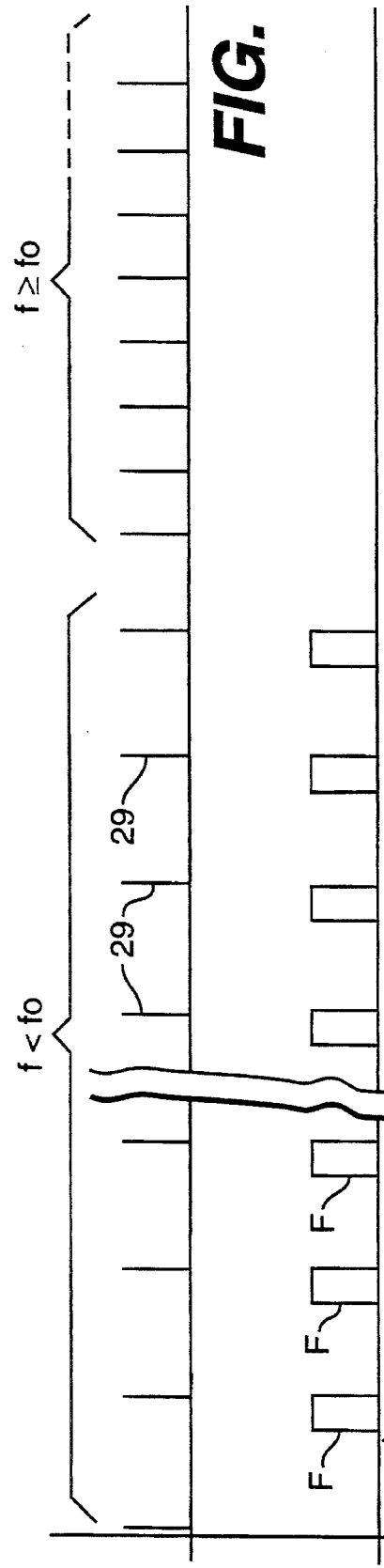
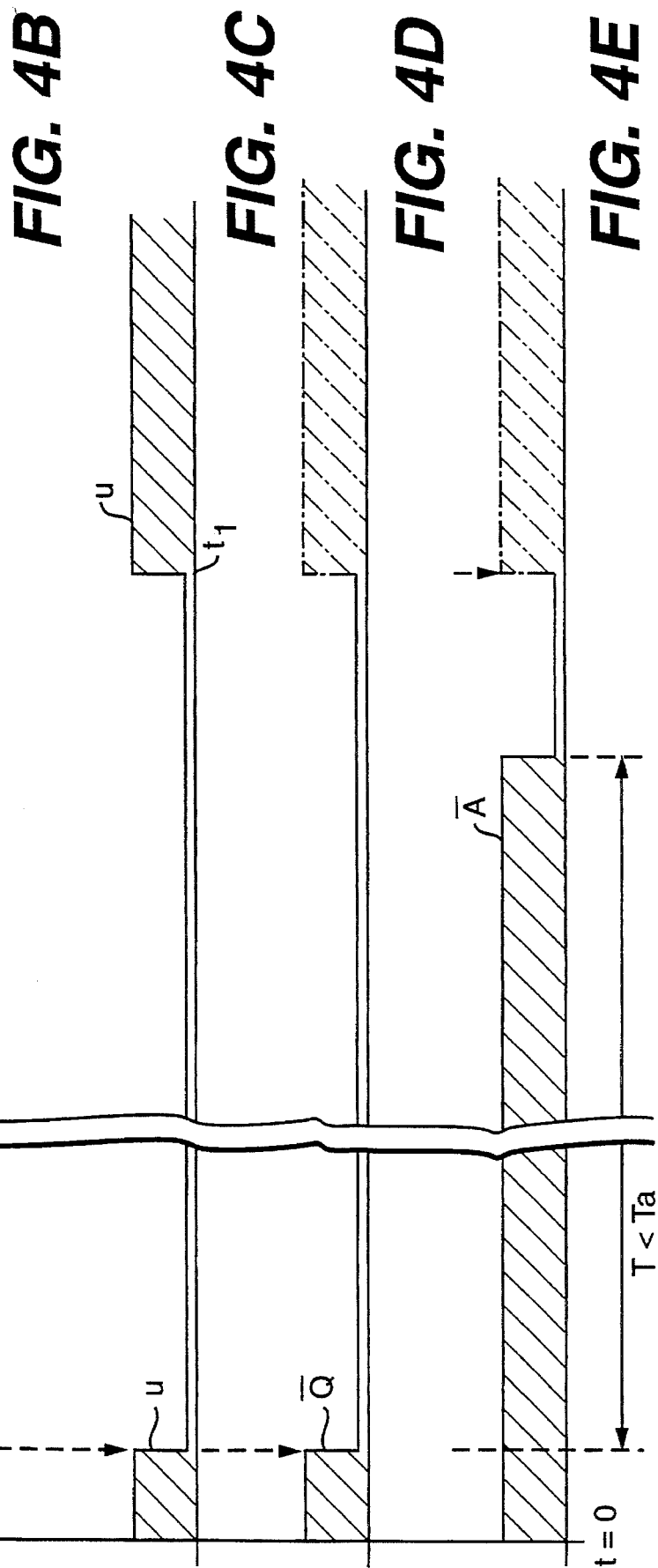

FREQUENCY MONITORING DEVICE

The invention relates to a frequency monitoring device for monitoring a frequency for longer lasting deviations from a desired value.

Such frequency monitoring devices are required for the most varied purposes. One example is the monitoring of the frequency in a linked system. If the frequency has deviated from its desired value for a given time a correction must take place, but not before this.

Another use is in the field of communications and computers. In this case the equipment is ventilated with the aid of so-called equipment fans, so as to dissipate the heat therefrom to the outside. The prerequisite is that the fans operate at the given speed, e.g. 2000 min$^{-1}$ (=2000 r.p.m.). If the speed of such a fan briefly drops below this level, e.g. for 5 seconds, this is not normally harmful. However, if it takes place for a longer time, cooling is no longer reliably ensured, because there is e.g. bearing damage in the fan and then an alarm signal must be issued, so that the fan can be replaced.

US-A-4 544 852 discloses an analog technology monitoring circuit, which fulfils these requirements and which has proved satisfactory in practice. This circuit responds to deviations from the desired speed, but only after a delay of e.g. 10 seconds. Therefore it is e.g. possible for an equipment fan to start without giving an alarm. An alarm is only triggered if the speed drops below a predetermined value for more than 10 seconds. However, this proven circuit suffers from the disadvantage that relatively large components are required for it and in particular large RC elements. However, equipment fans are very compact and have standardized external dimensions and consequently it is difficult to house such components in such an equipment fan. Deviations from the desired times can also result from the tolerances of the individual components.

The problem of the invention is therefore to bring about an improvement, particularly with respect to the construction volume and/or precision.

In a frequency monitoring device for monitoring a frequency for longer lasting deviations from a desired value, according to the invention this problem is solved in that a digital comparator is provided for comparing the cycle duration of said frequency with a predetermined time, said comparator being activated by a storage element in the case of a deviation from the predetermined time and triggers the emission of at least one deviation signal and that said at least one deviation signal can be supplied to a monitoring means, which monitors the time of the occurrence of said deviation signal and deactivates the storage element again if said time interval is smaller than the predetermined time interval. Thus, a very compact device is obtained, which can e.g. be constructed as an IC and which operates with digital precision.

With particular advantage a timer is associated with the storage element and triggers an alarm signal on exceeding a predetermined storage element activation time interval. This alarm signal makes it possible to e.g. switch off an equipment, or a signal of random type can be triggered.

Further details and advantageous developments of the invention are described in greater detail hereinafter relative to non-limitative embodiments, together with the subclaims, as well as the drawings, wherein show:

FIG. 1 a circuit diagram of a first embodiment of the inventive device.

Figure 2:
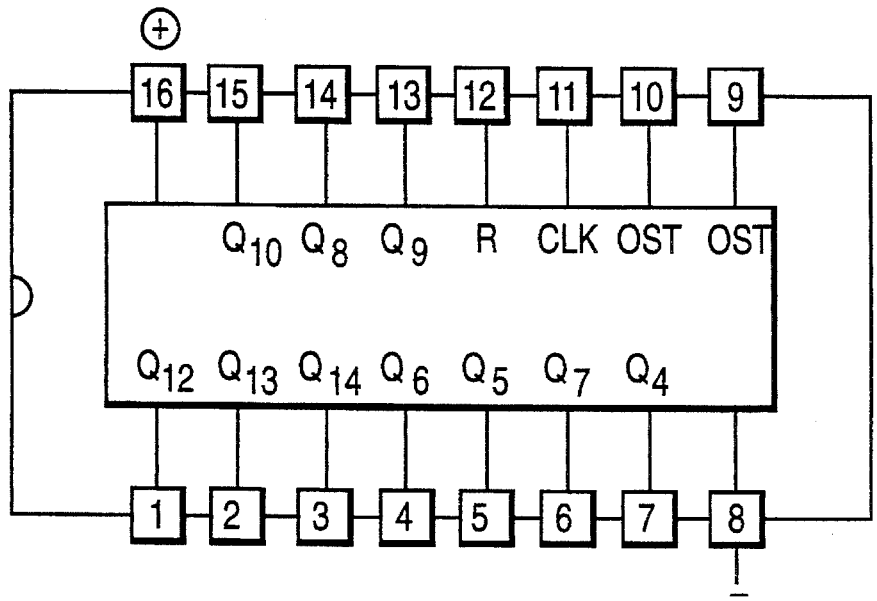

FIG. 2 a detail of FIG. 1.

FIGS. 3 and 4 diagrams for illustrating the operation of the device according to FIG. 1.

Figure 5:
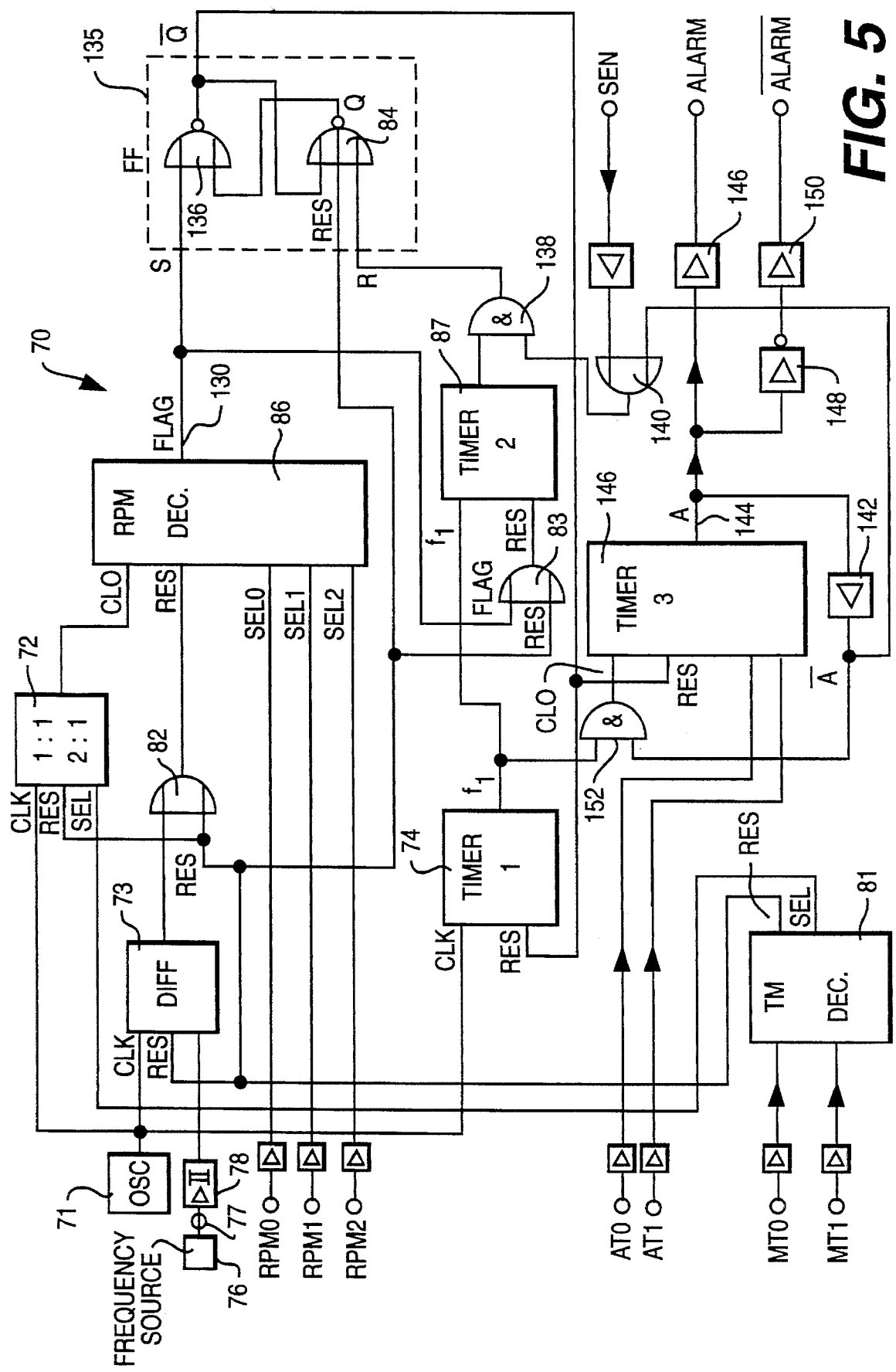

FIG. 5 a circuit diagram of a second embodiment of an inventive device.

Figure 6:
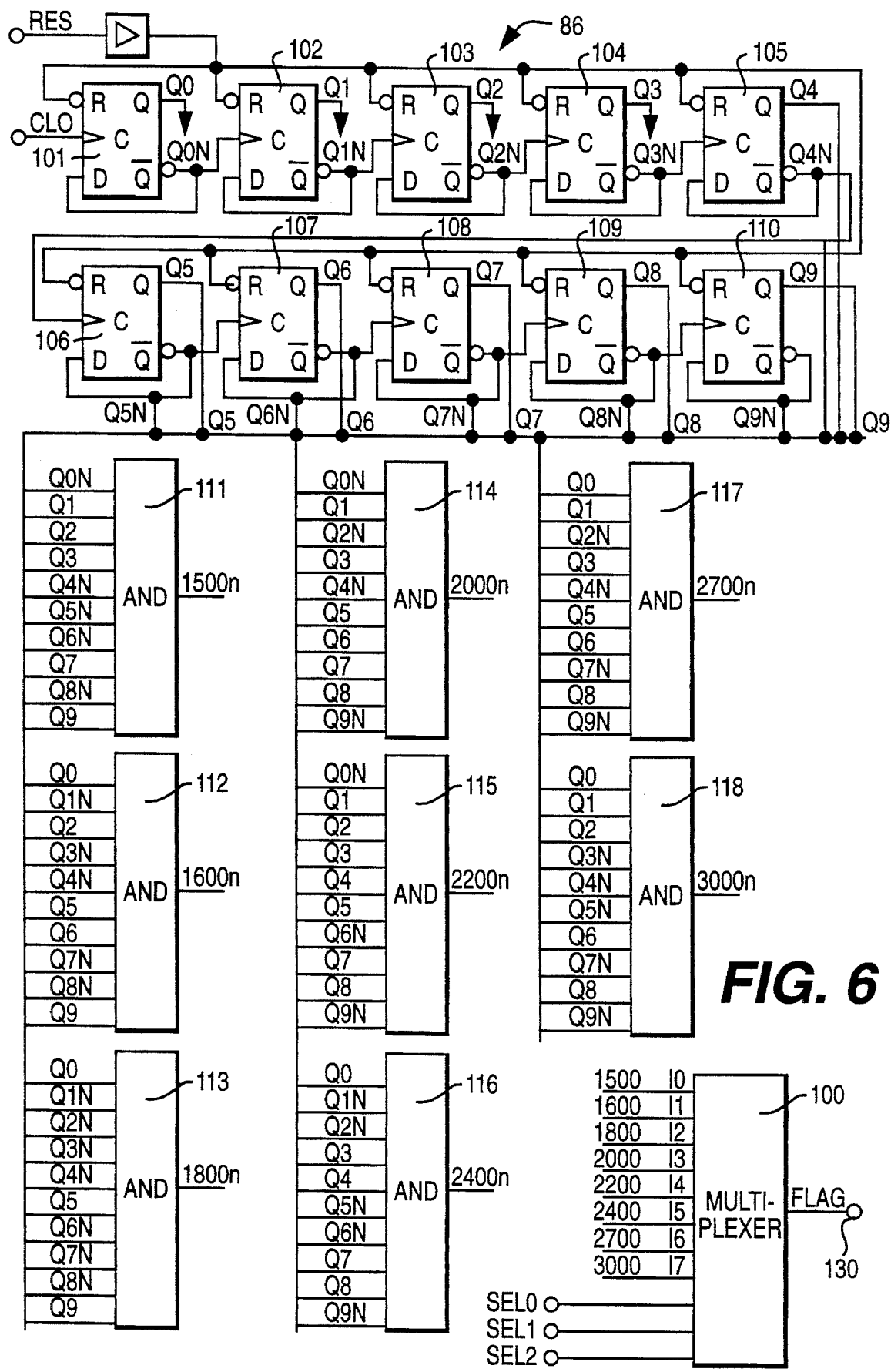

FIG. 6 a view of the comparator used in the device of FIG. 5.

Figure 7:
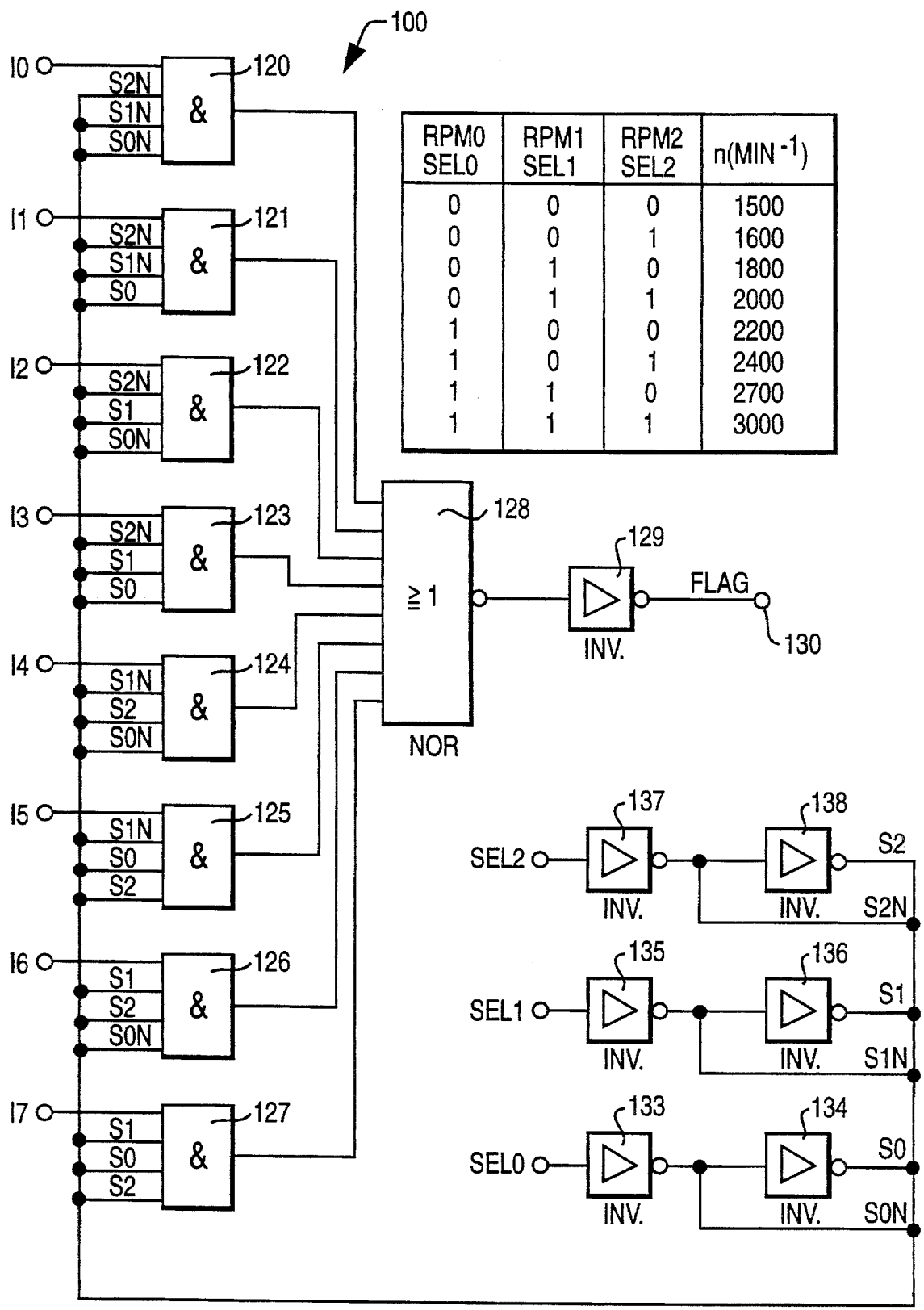

FIG. 7 a view of the multiplexer used in FIG. 6 and a table of digit
ally preselectable release or trigger speeds.

Figure 8:
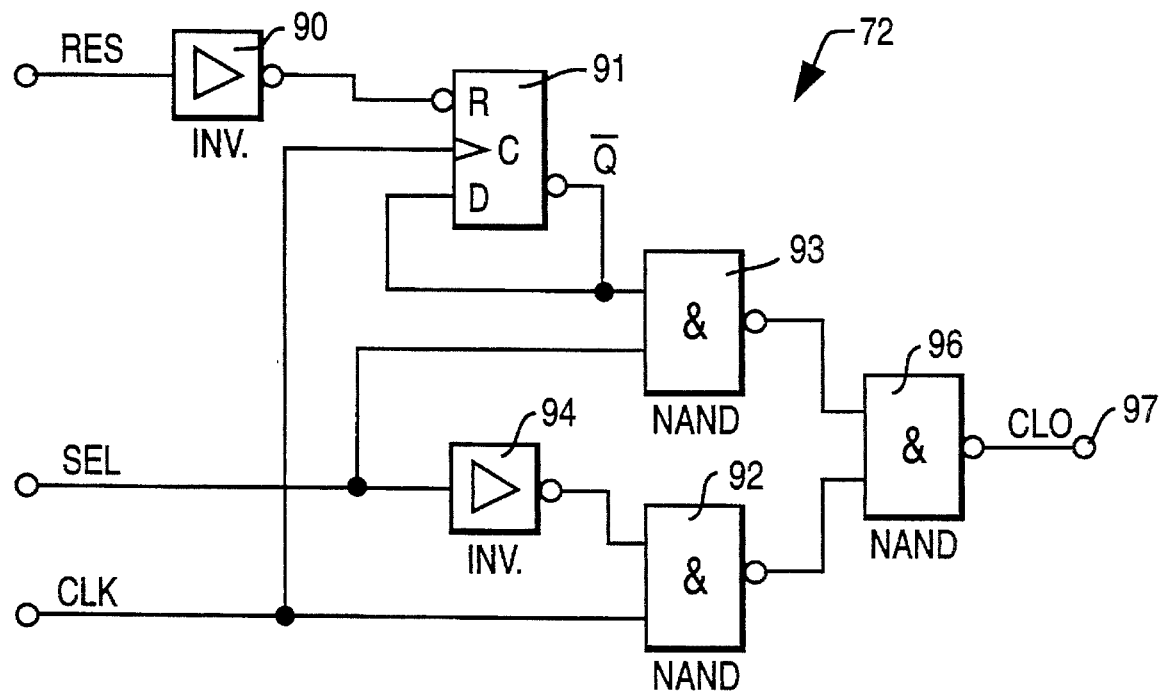

FIG. 8 a view of a means for switching from two to four pole motors in the device of FIG. 5.

FIG. 1 shows the construction of a first embodiment of an inventive frequency monitoring device 20. It operates with three binary counters 21,22, 23, e.g. of type CD 4060 B as shown in FIG. 2, in order to facilitate the understanding of the invention. This counter type, which is naturally only given as an example, is a 14-stage binary counter with incorporated oscillator. It divides the oscillator frequency by 16384 at the output of its final stage Q14. A capacitor 24 (e.g. 250 pF) is connected to the terminal 9 for the oscillator. Its other electrode is connected to a junction 25, from which leads a resistor 26 (e.g. 82 kOhm) to the input 10 and a resistor 27 (e.g. 560 kOhm) to the input 11. The incorporated oscillator of the counter 21 then oscillates with approximately 16.4 kHz, i.e. at the output Q14 (FIG. 3) a frequency of approximately 1 Hz is obtained corresponding to a cycle duration of 1000 ms, at the output Q13 a frequency of 2 Hz corresponding to a cycle duration of 500 ms and so on. This counter has a reset input R (terminal 12) and if a trigger pulse is applied to said terminal, then all the counter stages are set to zero and counting up is recommenced from this count. After 1000 ms a first pulse reaches the output Q14, after only 500 ms at output Q13 and so on.

If trigger pulses are now supplied with a frequency of 30 Hz e.g. to the input R, i.e. the terminal 12 of the counter 21, then the counter starts to count again at each trigger pulse. As the trigger pulses follow one another with a time interval of 1/30=33.3 ms, pulses appear neither at the output Q14, nor at the outputs Q13 to Q9, because the counter 21 is reset on each occasion before it reaches the corresponding counts. However, pulses do appear at the outputs Q8 to Q4, because these counts are reached. The combination of the counts reached is a precise measure of the distance between two trigger pulses. If e.g. the frequency drops from 30 to 1.5 Hz, not only are counts Q4 to Q8 reached, but also counts Q9 to Q13, but not count Q14.

Therefore if it is wished to monitor a downward deviation from the desired frequency of 30 Hz, it is only necessary to monitor the signal at the counter output Q9, because a signal only appears at the counter output Q9 if the frequency of the trigger pulses drops below 30 Hz.

Thus, in the counter 21 a comparison takes place between the cycle duration of the trigger signals supplied to the input 12 (R-input) with the times given in said counter by the oscillator frequency and the number of binary counting stages. As a function of the choice of the counter output (Q4 to Q14) or a combination of counter outputs, as described in the following second embodiment, it is possible to set a random frequency at which the device responds.

Account must also be taken of the following. If in the example the frequency drops from 30 to 28 Hz, pulses with a frequency of 28 Hz also occur e.g. at the counter output Q9, so that the counter 21 acts as a filter, which passes through pulses below the desired frequency, but with a time displacement.

In the embodiment the reset input R of the counter 21, i.e. its terminal 12, is connected to the output of a differentiating network 28, whose input is connected to a source 32 for the frequency to be monitored. In FIG. 1 it is e.g. a Hall generator and said source 32 can be a Hall-IC of type UGN 3077 which, as shown, is connected at a line 30 with the positive operating voltage (e.g. +5.6 V) and is connected to ground or earth 31.

In practice said Hall generator is e.g. that of a commutatorless direct current motor. German Patent 2 346 380 shows an example of such a commutatorless d.c. motor. This Hall generator controls the so-called commutation of the motor and its output signal, which is substantially square, is additionally used for speed monitoring, because the frequency of the output signal of this Hall generator is directly proportional to the motor speed. This frequency is very low. In the case of a bipolar motor with 3000 r.p.m.=50 r.p.s., it is e.g. 50 Hz. As a Hall-IC 32 supplies at its output substantially square signals 33, they are converted in the differentiating network 28 into needle pulses 29 of the same frequency, as shown in FIG. 1. Thus, with said needle pulses 29 the counter 21 is periodically reset and then starts to count again.

The signal F at the counter output Qg, i.e. the terminal 13 of the counter 21 and which is referred to hereinafter as the deviation signal, is supplied to the input R of the counter 22, i.e. its terminal 12, as well as to the setting input S of a bistable flip-flop FF 35 serving as the storage element and which in known manner comprises two NOR elements 36,37. As shown, the FF 35 has a reset input R and two exclusive OR outputs Q and Q/.

At the output Q4 of the counter 21, i.e. its terminal 7, is taken a low frequency of approximately 1 kHz and is supplied to an input of a NAND element 38, whose output signal is supplied across an inverting or NOT element 39 to the terminal 9 of the third counter 23, which serves as the alarm counter. If the alarm counter 23 is activated, then it counts up to its count level with a relatively low frequency, so that the desired long alarm times are obtained.

The inputs 16 of the three counters 21,22,23 are in each case connected to the positive line 30 and their inputs 8 are connected to ground 31. The storage element FF 35 can be constructed as an IC of type CD 4002 and then its terminal 14 is connected to the positive line 30 and its terminal 7 to ground 31, as shown in FIG. 1.

The signal from the oscillator of the counter 21 is, as shown, also supplied to the timing input 11 of the counter 22, so that both counters operate with the same frequency. If the counter 21 emits a deviation signal F, then the storage element FF 35 is activated across its setting input S and the speed deviation is stored.

Simultaneously, across the input 22, the second counter 22 is reset and starts to count. Its output Q12, i.e. its terminal 1, is connected to an input of a NAND element 40, whose output signal can be supplied across a NOT element 41 to the reset terminal R of the storage element FF 35. The signal at the output Q12 of the counter 22, i.e. its terminal 1, is designated U. It brings about a resetting of the storage element FF 35 if the duration T of the frequency deviation is below a predetermined alarm time Ta. Only in this case does the other input of the NAND element 40 receive a high input signal, as described hereinafter.

For further illustration purposes reference is made to FIG. 4. If the deviation signals F appear at the counter 21, because the frequency f of the needle pulses 29 have become too low, then said pulses F ensure that the signal U at the counter 22 becomes zero, because the pulses F follow one another so closely that the counter 22 cannot reach the count Q12 and consequently the signal U becomes low.

If the frequency of the needle pulses 29 rises again to the normal value fo, then the deviation pulses F stop, as is shown in the right-hand part of FIG. 4, and the counter 22 can then again count up to count Q12, so that the signal U becomes positive again at time t1. If the NAND element 40 simultaneously receives a second positive signal, then the storage element FF 35 can be reset, i.e. erased, without an alarm being triggered.

The second input of the NAND element 40 is connected to the output of an OR element 55. One input of said OR element 55 is, as shown, connected to the output of a switch 63, which can be connected to ground 31. As a result of this position frequency deviations which last longer than a predetermined time interval Ta are stored. Alternatively this switch 63 can be switched into its upper position and therefore makes one input of the OR element 55 high, in that it connects the same to the positive line 30. In this case an alarm stored in FF 35 is erased again, if the frequency deviation has lasted longer than the predetermined time interval Ta. Therefore the signal at the output of the switch 63 corresponds to the signal SEN in the second embodiment according to FIG. 5.

For the following description it is assumed that the switch 63 is in the represented position and a low signal is supplied to the second input of the OR element 55. If the storage element 35 is activated by a signal F, the signal Q/ becomes low at its output Q/. This signal is supplied across an OR element 43 to the reset input R (terminal 12) of the third counter 23 and brings about the resetting thereof and counting starts again, namely with the lower frequency of e.g. 1 kHz supplied by the counter 21. If the counter 23 reaches the count Q14, for which purpose the alarm time Ta is required, its previously low terminal 3 at which the signal A appears becomes high. Across a resistor 45 a npn transistor 46 is connected to its output and in the transistor emitter circuit is located a red light-emitting diode 47, which in this case lights up and indicates the alarm.

The signal A is supplied to a NOT element 49, at whose output is available the inverted signal A/. This signal is supplied to the other input of the NAND element 38 and consequently blocks the latter if said signal is low, so that then no further counting pulses are supplied to the input 9 of the counter 23 and the latter locks itself in this alarm position.

Across a resistor 50 the inverted signal A/is supplied to a npn transistor 51, whose emitter circuit contains a green light-emitting diode 52. Its lighting up indicates that there has been no drop below the desired frequency fo, so that e.g. in the case of a fan its motor operates with a speed in the permitted range. By means of a resistor 53 the collectors of the transistors 46 and 51 are connected to the positive line 30.

The inverted signal A/ is also supplied to the other input of the OR element 55. If the signal A/ has become low, because the alarm time Ta has been exceeded, then in the represented position of the switch 63 the NAND element 40 is blocked by the signal A/ across the OR element 55, so that a modification of the signal U (from counter 22) from low to high is not transferred to the reset input R of the storage element FF 35 and consequently said storage element cannot be erased again.

There are three alternatives:

a) The frequency deviation lasts for a shorter time than the time Ta given by the alarm counter 23. If in this case the signal U changes from low to high, it is passed through by the NAND element 40 and can therefore reset or erase the storage element 35 and in this case no alarm is given.

b) The switch 63 is in the represented position and the frequency deviation lasts longer than the time Ta given by the counter 23. Then, across the OR element 55, the inverted signal A/ blocks the NAND element 40 and the signal U, which only becomes high again after the end of the frequency deviation, can no longer erase the storage element 35, so that the alarm remains stored.

c) However, if the switch 63 is in its other position in which it makes one input of the OR element 55 high and the frequency deviation lasts longer than the predetermined time Ta, then the inverted signal A/ cannot block the NAND element 40 and if after a longer time, e.g. after a few seconds, the signal U becomes high again, because the frequency has then again normalized, it is let through by the NAND element 40 and can reset the storage element FF 35, so that then the alarm is cancelled. Thus, in this case an alarm is only indicated for as long as the monitored frequency is too low.

The other input of the OR element 43 is connected to a point 57, which is connected across a capacitor 59 to the positive line 30 and across a capacitor 60 to ground 31. On switching on the capacitor 59 charges across the resistor 60 and consequently there is a positive starting pulse at the point 57, which is supplied to the input 12 of the counter 23 and resets the same to zero.

Mode of operation (FIGS. 1 to 4)

Reference is made to FIGS. 3 and 4, where at A) are shown the needle pulses 29 (at the output of the differentiating network 28) with the frequency f to be monitored. In the left-hand part of the diagram this frequency is too low. These diagrams differ through the following:

In FIG. 3 the time T during which the frequency is too low is short. This arrangement does not respond to the frequency deviation. In FIG. 4 the said time is longer than the alarm time Ta predetermined by the counter 23. Therefore the device responds here and an alarm is given and stored, it being assumed that the switch 63 is in the indicated position.

If the frequency f is so much lower than fo that in counter 21 the count Q9 is reached and at its terminal 23 continuously appears a deviation signal F, then the counter 22 is constantly reset at its R terminal by the signals F, so that the signal U of the counter 22 becomes low. Simultaneously the first signal F activates the storage element FF 35, so that its output signal Q/becomes low. This change to the signal Q/ starts up the counter 23 across the OR element 43, so that the alarm time Ta starts to run. These processes are the same in FIGS. 3 and 4.

In FIG. 3 after e.g. 3 seconds the frequency f becomes normal again and this process takes place within the alarm time Ta given by the alarm counter 23. Therefore the deviation signals F from the counter 21 stop and therefore the counter 22 can again count up to Q12, so that at its terminal 1 the signal U at time t2 (FIG. 3) becomes high again.

As at this time the signal A/ is still high, this change to the signal U can be transmitted across the NAND element 40 to the reset input R of the storage element FF 35 and erases the latter again. Therefore the signal Q/ at the output of FF 35 becomes high again, so that across the OR element 43 the terminal 12 of the counter 3 is made high again and the alarm counter 23 is again reset.

In FIG. 4 the frequency f only becomes normal again after the alarm time Ta of e.g. 10 seconds. In this case at the expiry of the time Ta the output A of the alarm counter 23 becomes high and consequently the signal A/ low, so that, as described, in the represented position of the switch 63 the alarm counter 23 is locked in this count position and through the blocking of the NAND element 40 it is ensured that the signal U, which only becomes high again at the end of the alarm time Ta, does not again erase the storage element FF 35.

However, if the switch 63 is in its other position, in which it makes high the input of the OR element 55 associated therewith, the other input of the NAND element 40 remains continuously high. If in this case at the expiry of the alarm time Ta and at time t1 (FIG. 4), the signal U from the counter 22 is positive, because the monitored frequency has normalized again, then this signal U is transmitted to the reset input of FF 35 and erases the same, so that its signal Q/ again becomes high, as shown to the right of FIG. 4 with dot-dash lines. This modification of the signal Q/ is transmitted across the OR element 43 to the reset input (terminal 12) of the alarm counter 23 and resets it to zero, so that the signal A again becomes low and the signal A/ again becomes high, so that the alarm is cancelled out and the green light-emitting diode 52 lights up again to indicate normal operation. This change to the signal A/ is also shown to the right in FIG. 4 by dot-dash lines.

Whereas the circuit according to FIG. 1 comprises several counter components, FIG. 5 shows a circuit particularly suitable for construction as an IC. FIG. 5 shows a second embodiment of an inventive monitoring device 70. Compared with the embodiment according to FIG. 1, it has the advantage that four different alarm times can be set with the two signals AT 0 and AT 1, that with the inputs MT 0 and MT 1 the device can be set to two or four-pole electric motors, that with the input SEN it is possible to set whether an alarm signal continues to be stored if the frequency normalizes again, or if then storage is discontinued, and that it is possible to set with the three inputs RPM 0, RPM 1 and RPM 2 eight different frequencies, which when reached leads to the triggering of an alarm signal. If the device according to FIG. 5 is used with an electric motor, the latter can be monitored for dropping below eight different speeds, only one speed being set for monitoring.

The signals at the inputs, e.g. AT 0 and AT 1 are given in that the particular input is either made low by connecting it to ground, or is made high by connecting it to the positive operating voltage. In the former case the signal at it is a logic "zero" and in the second case a logic "one", e.g. the signals at the inputs AT 0 and AT 1 can be combined in the following way:

| AT0 | AT1 | Alarm delay (s) |
|-----|-----|-----------------|
| 0 | 0 | 5 |
| 0 | 1 | 10 |
| 1 | 0 | 15 |
| 1 | 1 | 20 |

As the device according to FIG. 5 is preferably constructed as an IC, the corresponding connections of these inputs can take place on the circuit board carrying the IC. Normally this takes place with solder connections, but can also take place by using switches, e.g. so-called dip switches. As shown, the individual inputs are in each case connected across an amplifier to the monitoring device 70.

The monitoring device 70 has an oscillator 71, which can e.g. be controlled by a not shown watch quartz with a frequency of 32 768 Hz. Alternatively the oscillator can be part of the IC. The signal CLK of the oscillator 71 is, as shown, supplied with different subassemblies, namely a switchable frequency divider 72 which, as a function of the state of its input SEL, either transmits unchanged the frequency of the oscillator 71 or divides it in a ratio of 2:1, as well as a differentiating network 73 and a frequency divider 74 which, if it is switched on, divides the said frequency e.g. by a factor of 256, so that its output frequency f1 is 128 Hz.

An external frequency source 76 to be monitored can be connected across a terminal 77 and an amplifying element 78 with transient behaviour to the differentiating network 73. As shown, to the third input of the differentiating network 73 can be supplied a reset signal RES which, controlled by the signal MT0, is generated by a control unit 81, which also, controlled by the signal MT1, generates the signal SEL. As shown, the reset signal RES is supplied to the frequency divider 72, the differentiating network 73, an OR element 82, an OR element 83 and a NOR element 84. To the other input of the OR element 82 is supplied the output signal of the differentiating network 73 and its output signal is supplied to the input RES of a RPM decoder 86, which has the same function as the counter 21 according to the first embodiment of FIG. 1.

To the other input of the OR element 83 is supplied the output signal of the RPM decoder 86 designated as a flag and its output signal is supplied to the input RES of a counter 87, whose function corresponds to that of the counter 22 in FIG. 1. To its count input is supplied the frequency f1 by the frequency divider 74, e.g. a frequency of 128 Hz.

To the count input CLO of the RPM decoder 86 is supplied the output signal of the switchable frequency divider 72, i.e. in the present embodiment either a frequency of 32 768 Hz (for a four-pole electric motor) or 16 384 Hz (for a bipolar electric motor) provided that a galvanomagnetic sensor is used as the frequency generator 76. This can e.g. be the Hall generator or the Hall-IC of a commutatorless d.c. motor. (In the case of a four-pole motor the Hall generator generates per motor revolution two positive and two negative pulses, whereas with a bipolar motor it only generates one positive and one negative pulse).

FIG. 8 shows the construction of a switchable frequency divider 72. Its RES input is connected across an inverting or NOT element 90 to the inverting R-input of a D-flip-flop 91. The CLK signals are supplied to the C-input of said FF 91 and to one input of a NAND element 92. The signal SEL is supplied to an input of a NAND element 93 and, across a NOT element 94, to the other input of the NAND element 92.

The output Q/ of the D-flip-flop 91 is connected to its D-input and to the other input of the NAND element 93. The output signals of the two NAND elements 92,93 are supplied to a NAND element 96, at whose output 97 is received the signal CLO, which is supplied to the input CLO of the RPM decoder 86. If the frequency in the switchable frequency divider 72 is not to be divided, e.g. when operating with a four-pole motor, then across the signal MT1 the signal SEL is made low, i.e. to a logic zero. In this case the clock pulses CLK are transmitted unchanged by the two NAND elements 92,96 and the frequency is not divided.

If the frequency of the clock signal CLK is to be divided by two, then across the signal MT1 the signal SEL is made high (logic 1). In this case every other clock pulse is suppressed in the D-flip-flop 91, so that clock signals CLO with half the frequency appear at the output 97. This operating mode is used with a bipolar motor and can naturally also be used with a four-pole motor, if very slow speeds are to be monitored there.

FIG. 6 shows the circuit of the RPM decoder 86, which has at its output a multiplexer 100, which is shown in detail in FIG. 7.

The RPM decoder 86 contains ten series-connected D-flip-flops 101 to 110. As shown, the reset signal RES is supplied to the inverted R-inputs of all FF 101 to 110 in the same way. The CLO-pulses from the switchable frequency divider 72 are supplied to the C-input at FF 101. In each case the D-input is connected to the output Q/ and in the case of the D-flip-flop 101 said output is connected to the C-input of the D-flip-flop 102. The Q/ output of the flip-flop 102 is connected to the C-input of the D-FF 103 and so on to FF 110, in which only the D-input and the Q/-output are interconnected. Therefore it is a ten-stage binary counter, like that shown in FIG. 2, with the difference that the latter has 14 stages. At its outputs Q and Q/, each D-flip-flop 101 to 110 emits a signal. For example, the D-flip-flop 101 emits at its output Q the signal Q0 and at its output Q/ the inverse signal Q0N, FF 102 at its output Q the signal Q1 and at its output Q/ the signal Q1N, etc., as can be clearly gathered from the drawing. Thus, in all ten signals Q0 to Q9 are obtained and ten inverse signals Q0N to Q9N.

There are also eight AND elements 111 to 118. Each of them has ten inputs and to these are in each case supplied specific signals from the ten FF 101 to 110, in order to decode specific speeds. If e.g. at the given clock frequency of 32 768 Hz the following states of the individual flip-flops (after preceding resetting at the input RES) are simultaneously high, namely Q0N, Q1, Q2, Q3, Q4N, Q5N, Q6N, Q7, Q8N and Q9, then since the reset pulse a time of 39.978 ms has elapsed and the counter 86 has counted 1310 pulses. In the case of a bipolar motor this corresponds to a speed of 1000: 39.876×60=1500 r.p.m., i.e. if the time between two pulses from a Hall generator as the frequency source 76 to the input RES of the RPM decoder 86 is e.g. 41 ms, i.e. the frequency is below 25 Hz or the speed of a motor is below 1500 r.p.m., then a signal is generated at the output of the AND element 111, because the said AND element is supplied with the indicated signal combination and can only generate a signal when this signal combination appears. The other AND elements 112 to 118 are correspondingly connected.

The AND element 112 (1600 r.p.m.) responds if the counting stages 101 to 110 are supplied with 1228 pulses after a resetting and for this purpose it receives the signals Q0, Q1N, Q2, Q3N, Q4N, Q5, Q6, Q7N, Q8N, Q9.

The AND element 113 (1800 r.p.m.) responds, if the counting stages 101 to 110 have been supplied with 1092 pulses after resetting and for this purpose it recieves the signals Q0, Q1N, Q2N, Q3N, Q4N, Q5, Q6N, Q7N, Q8N and Q9.

The AND element 113 (2000 r.p.m.) responds if the counting stages 101 to 110 have been supplied with 983 pulses after resetting and for this purpose it receives the signals QoN, Q1, Q2N, Q3, Q4N, Q5, Q6, Q7, Q8, Q9N.

The AND element 115 (2200 r.p.m.) responds, if the counting stages 101 to 110 have been supplied with 894 pulses after resetting and it receives for this purpose the signals QoN, Q1, Q2, Q3, Q4, Q5, Q6N, Q7, Q8, Q9N.

The AND element 116 (2400 r.p.m.) responds, if the counter stages 101 to 110 have been supplied with 819 pulses after resetting and for this purpose it receives the signals Qo, Q1N, Q2N, Q3, Q4, Q5N, Q6N, Q7, Q8, Q9N.

The AND element 117 (2700 r.p.m.) responds, if the counter stages 101 to 110 are supplied with 728 pulses after resetting and for this purpose it receives the signals Qo, Q1, Q2N, Q3, Q4N, Q5, Q6, Q7N, Q8, Q9N.

The AND element 118 (3000 r.p.m.) responds, if the counter stages 101 to 110 have been supplied with 656 pulses after resetting and for this purpose it receives the signals Q0, Q1, Q2, Q3N, Q4N, Q5N, Q6, Q7N, Q8, Q9N.

Thus, if the speed is below 1500 r.p.m., all eight AND elements 111 to 118 emit a signal at their outputs, because then the counter has been supplied with more than 1310 pulses before a new pulse reaches the reset input RES.

For the selection of the desired speed at which an alarm is triggered, the multiplexer 100 shown in detail in FIG. 7 is provided. It has eight inputs I0 to I7 for the speed signals of the eight AND elements 111 to 118, as is clearly shown in FIG. 6. It also has three inputs SEL0 to SEL2 for the selection of the desired speed. FIG. 7 shows in the top right-hand part of the table, which combination of signals selects which speed. If e.g. all three inputs RPM0, RPM1 and RPM2 are low, then all three signals SEL0, SEL1 and SEL2 are low and the alarm speed 1500 r.p.m. is selected, i.e. if the frequency at the input has dropped sufficiently low to correspond to this alarm speed, the monitoring device comes into operation.

The multiplexer 100 has eight AND elements 120 to 127, the AND element 120 with the input I0, the AND element 121 with the input I1, etc. The outputs of all the AND elements 120 to 127 are led to a NOR element 128 with eight inputs. To its output is connected a NOT element 129 and at its output 130 the flag signal is obtained if there is a drop below the set speed.

The signal SEL0 is supplied to a NOT element 133 to which is connected a NOT element 134. Thus, at the output of the NOT element 133 is obtained the signal S0N and at the output of the NOT element 134 the signal S0. The signal SEL1 is supplied to two series-connected NOT elements 135, 136 and the signals S1N and S1 are obtained there. The signal SEL2 is supplied to two series-connected NOT elements 137,138 and the signals S2N and S2 are received there. These signals are supplied in corresponding combination to the other three inputs of the AND elements 120 to 127.

For example, the AND element 120 receives the three signals S0N, S1N and S2N, so that it is only activated if the three signals RPM0, RPM1 and RPM 2 are low. If it is activated, it lets through the signal I0, the signal for 1500 r.p.m. The other AND elements are connected in the same way, as is clearly shown in FIG. 7.

Thus, at its output 130, the RPM decoder 86 emits a flag signal, if the limit speed set by the signals RPM0, RPM1 and RPM2 is reached or dropped below. If it occurs, said flag signal is supplied to the setting input S of a flip-flop 135 serving as the storage element (like FF 35 in FIG. 1) and is stored there. Apart from the NOR element 84 with three inputs, said FF 135 contains a NOR element 136 with two inputs, whereof one is the setting input S. The output of the NOR element 136 is connected to the output Q and is connected to an input of the NOR element 84. Conversely the output Q/ of the NOR element 84 is connected to the other input of the NOR element 136. Finally, the third input of the NOR element 84 serves as a reset input R and is connected to the output of an AND element 138. One input of said AND element 138 is connected to the output of the counter 87, whilst the other is connected to the output of an OR element 140, to one of whose two inputs is supplied the signal SEN, which determines whether an alarm remains stored or not (SEN=0 alarm continuously stored; SEN=1 alarm not continuously stored). The other input of the OR element 140 is connected to the output of a NOT element 142, whose input is connected to the output 144 of a counter 146, which corresponds to the counter 23 in FIG. 1. To the output 144 is connected across an amplifier 146 an output for the signal ALARM. To it is also connected across a NOT element 148 and an amplifier 150 an output for the signal ALARM/ (=no alarm).

To the output of the NOT element 142 is also connected the input of an AND element 152, to whose other input is supplied the signal f1 from the output of the frequency divider 74 (128 Hz in the embodiment) the output of the AND element 152 is connected to the counting input CLO of the counter 146. The reset inputs RES of the frequency divider 74 and the counter 146 are connected to the output Q of FF 135 serving as the storage element. As explained, the counter alarm time can be modified stepwise by the signals AT0 and AT1.

Mode of operation

On switching on the following functional blocks are reset by the RES signal from the control stage 81: differentiating network 73, RPM decoder 86, counter 87 (across the OR element 83), storage element FF 135, frequency divider 74 and counter 146.

If the frequency to be monitored supplied at the input 77 is above the value set on the RPM decoder 86, no signal flag appears thereon. The storage flip-flop 135 is not set and consequently it blocks the frequency divider 74 and the counter 146 and no alarm signal A is received at the output 144 of the counter 146.

If the frequency supplied at input 77 drops for a short time interval below the value set on the RPM decoder 86, as described, the signal flag appears there at output 130 and activates the storage component FF 135. As a result of its output signal Q the frequency divider 74 is released and emits pulses with the frequency f1. This output signal Q also resets the counter 146 and it starts to count with the frequency f1. Finally, the counter 87 is directly reset by the signal flag across the OR element 83 and also starts to count with the frequency f1.

After a short time the frequency at the input 77 is raised to its normal value and consequently the signal flag no longer appears at the output 130. Following the last flag signal the counter 87 can now count up to its maximum count and then emits at its output, e.g. 125 ms after the last flag signal, a reset signal, which is supplied across the AND element 138 to the storage element FF 135 and erases the same again. Thus, the frequency divider 74 is blocked and the counter 146 reset. Thus, no alarm is triggered. If there is again a drop below the set speed or set frequency f0, a new monitoring cycle can begin.

If the frequency at the input 77 drops below the predetermined value for a longer time, then at the RPM decoder 86 appears the error signal flag through which the storage element FF 135 is activated. Through its output signal Q it release the frequency divider 74, so that the latter emits pulses with the frequency f1. Through said signal Q the counter 146 is also reset and starts to count with the frequency f1. The counter 87 is also directly reset by the signal flag, periodically appearing at the output 130 on dropping below the frequency and it starts to count anew at each signal flag. Consequently this counter cannot generate a signal at its output, as described relative to FIG. 1, so that the storage element FF 135 is not erased. Therefore the counter 147 counts on until the alarm time set at its inputs AT0 and AT1 is reached. Then the signal A appears at its output 144 and consequently at the output of the NOT element 142 appears the signal A/, which then becomes low and blocks the AND element 152. As a result, the counter 146 no longer receives count pulses f1 at its input CLO and is locked in the count position reached.

If the signal SEN is low, then through the now also low signal A/ the OR element 140 is blocked, so that the AND element 138 does not let through a reset signal from the counter 87 if, at the end of the alarm time Ta, the frequency again becomes normal and the flag signals stop. The alarm signal then remains stored and is constantly displayed. Conversely if SEN=1, the AND element 138 passes through a reset pulse from the output of the counter 87, if the frequency at the input 77 has become normal again. In this case the storage of the alarm is erased again at the end of the alarm time and the alarm at the output ALARM is only displayed when there is a drop below the frequency. In this case the further sequence is the same as described hereinbefore for the case when there is a brief drop below the frequency, i.e. the frequency divider 74 and counters 87 and 146 are then reset and monitoring of the frequency continues.

Thus, in the invention, a frequency to be monitored for the continuous measurement of its cycle duration is supplied to the counter 86. The latter is set in such a way that in the case of a drop of this frequency, i.e. in the case of a rise of its cycle duration, it reaches a specific count and then continuously emits flag signals for as long as this state lasts. The first error signal which occurs sets a flip-flop 135 and the latter in turn puts into operation the timer 146 which, after a certain time triggers an alarm if it is not stopped beforehand by resetting the flip-flop 135. The error signals are also continuously supplied to a second counter 87, which is designed in such a way that in the time interval between two error signals it cannot reach a specific, high count. If the frequency to be monitored now again becomes normal, then the error signals are cancelled out and the final error signal again starts said second counter 87, so that the latter counts up to the specific, high count and on reaching it emits a reset signal. If the alarm has not yet been triggered, said reset signal can reset, i.e. erase the flip-flop 135. Therefore the timer 146 is stopped and the triggering of an alarm prevented. In this way, e.g. an electric motor, whose speed is monitored by the tachometer 76, can start on switching on without triggering an alarm.

We claim:

1. A device for monitoring a frequency (f) for relatively long lasting deviations from a desired value (f0), in which a first counter is provided for counting cycles of a frequency (CLK) higher than a substantial multiple of f0, the first counter being reset by a pulse of the frequency (f) to be monitored and then counting cycles of frequency (CLK) until the next such pulse is received, the count of the first counter increasing upon decrease of the frequency (f) to be monitored, and when the count of the first counter reaches a first elevated count the first counter emitting a deviation signal (Flag), the device for monitoring comprising:

monitoring means including a second counter for monitoring the time interval of the recurrence of said deviation signals, said second counter starting counting at each deviation signal and having a preset count or level that is normally not reached between two successive deviation signals but is reached if no further deviation signal appears, the second counter emitting a reset signal, if said preset count or level is reached; and a third counter starting counting at the first deviation signal and having a further preset count or level representing a time interval (Ta), the third counter triggering an alarm signal if the preset count or level is reached or being reset by said reset signal if said preset count or level is not reached.

2. The device according to claim 1, further comprising:

a storage element that is activated when a deviation signal (Flag) is emitted and is reset when the reset signal is emitted.

3. The device according to claim 2, further comprising a blocking element that blocks the supply of the reset signal from the second counter to the storage element after the third counter reaches the preset count or level representing the time interval (Ta).

4. The device according to claim 3, wherein the blocking element includes a switch to switch off the blocking of the reset signal.

5. The device according to any of claims 1 to 4, wherein the third counter triggers an alarm signal upon reaching the preset count or level and locks itself.

6. The device according to claim 5, comprising means for manually selecting the preset count or level of the third counter.

7. The device according to any of claims 1–4, further including an electric motor, the electric motor producing the frequency to be monitored in relationship to its speed of rotation.

8. The device according to claim 7, characterized in that the electric motor is a commutatorless direct current motor having a rotor position sensor that serves as a generator for the frequency (f) to be monitored.

9. The device according to any of claims 1 to 4 comprising the first counter for counting cycles of the frequency (CLK);

means for supplying the signal of the frequency (CLK) to the first counter as a counting pulse train; and means for modifying the frequency (CLK of the signal.

10. A device for monitoring a frequency (f) for relatively long lasting deviations from a desired value (f0, in which a counter is provided for counting cycles of a frequency (CLK) higher than a substantial multiple of f0, the counter being reset by a pulse of the frequency (f) to be monitored and then counting cycles of frequency (CLK) until the next such pulse is received, the count of the counter increasing upon decrease of the frequency (f) to be monitored, and when the count of the counter reaches a first elevated count the counter emitting a deviation signal (Flag), the device for monitoring comprising:

a storage element which is activated when a deviation signal (Flag) is emitted; and monitoring means for monitoring the time interval (T) of the recurrence of said deviation signals without return of frequency (f) to a normal range and for resetting the storage element when said time interval (T) is smaller than a time interval (Ta) on account of the return of the frequency (f) to the normal range, the monitoring means having a monitoring counter that counts cycles of a frequency (f1) and on reaching a predetermined count emits a signal (U) resetting said monitoring counter and starting a new counting process therein; wherein the predetermined count of the monitoring counter at which the signal (U) is emitted is only reached upon no recurrence of the deviation signal during another time interval; and wherein the signal (U) emitted by the monitoring counter on reaching the predetermined count is only supplied to the storage element as the reset signal during the other time interval.

11. The device according to claim 10, wherein the monitoring counter counts the cycles of the frequency (f1) that is constant and wherein the monitoring means includes an alarm counter to which the constant frequency (f1) is supplied and that emits an alarm signal upon counting cycles equivalent to the time interval (Ta) throughout which the storage element is activated.

12. The device according to claim 10, wherein the monitoring means includes a timer that triggers an alarm signal on exceeding the time interval (Ta) throughout which the storage element is activated.

13. A device for monitoring a frequency (f) for relatively long lasting deviations from a desired value (f0), in which a counter is provided for counting cycles of a frequency (CLK) higher than a substantial multiple of f0, the counter being reset by a pulse of the frequency (f) to be monitored and then counting cycles of frequency (CLK) until the next such pulse is received, the count of the counter increasing upon decrease of the frequency (f) to be monitored, and when the count of the counter reaches a first elevated count the counter emitting a deviation signal (Flag), the device for monitoring comprising:

a storage element which is activated when a deviation signal (Flag) is emitted;

monitoring means for monitoring the time interval (T) of the recurrence of the deviation signals without return of frequency (f) to a normal range and for resetting the storage element when said time interval (T) is smaller than a time interval (Ta) on account of the return of the frequency (f) to the normal range; and means for emitting an alarm signal after the time interval (T) exceeds the time interval (Ta) without resetting of the storage element.

* * * * *